(12) United States Patent  
Mei et al.

(10) Patent No.: US 12,183,617 B2
(45) Date of Patent: Dec. 31, 2024

(54) ALIGNMENT MASK, METAL MASK ASSEMBLY, AND PREPARATION METHOD THEREFOR

(71) Applicants: Chengdu BOE Optoelectronics Technology Co., Ltd., Chengdu (CN); BOE Technology Group Co., Ltd., Beijing (CN)

(72) Inventors: Ju Mei, Chengdu (CN); Peng Xu, Chengdu (CN); Jianbo Ye, Chengdu (CN); Guoqiang Ma, Chengdu (CN); Leifang Xiao, Chengdu (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 702 days.

(21) Appl. No.: 17/295,730

(22) PCT Filed: Aug. 18, 2020

(86) PCT No.: PCT/CN2020/109790
§ 371 (c)(1),
(2) Date: May 20, 2021

(87) PCT Pub. No.: WO2021/047356
PCT Pub. Date: Mar. 18, 2021

(65) Prior Publication Data
US 2022/0013396 A1 Jan. 13, 2022

(30) Foreign Application Priority Data
Sep. 10, 2019 (CN) .......................... 201910851395.9

(51) Int. Cl.
*H01L 21/68* (2006.01)
*C23C 14/04* (2006.01)
(Continued)

(52) U.S. Cl.
CPC .......... *H01L 21/682* (2013.01); *C23C 14/042* (2013.01); *C23C 16/042* (2013.01); *H01J 37/32651* (2013.01); *H01J 37/3447* (2013.01)

(58) Field of Classification Search
CPC ....... C23C 14/042; C23C 14/12; C23C 14/24; C23C 16/042; H01L 21/682; H01J 37/3447; H01J 37/32651
(Continued)

(56) References Cited

FOREIGN PATENT DOCUMENTS

| CN | 102766841 A | 11/2012 |
|---|---|---|
| CN | 103695840 A | 4/2014 |

(Continued)

OTHER PUBLICATIONS

Office Action received for Chinese Patent Application No. 201910851395, mailed on Jan. 5, 2021, 21 pages (12 pages of English Translation and 9 pages of Original Document).
(Continued)

*Primary Examiner* — Rodney G McDonald
(74) *Attorney, Agent, or Firm* — Workman Nydegger

(57) ABSTRACT

Disclosed are an alignment mask, a metal mask assembly, and a preparation method therefor. The alignment mask includes a mask body. The mask body includes: multiple alignment holes; and, separating parts surrounding at least some alignment holes and used for separating the areas at where the at least some alignment holes are located from other areas, where the separation parts include at least one semi-etched line.

15 Claims, 4 Drawing Sheets

(51) Int. Cl.
*C23C 16/04* (2006.01)
*H01J 37/32* (2006.01)
*H01J 37/34* (2006.01)

(58) Field of Classification Search
USPC .................................................. 204/298.11
See application file for complete search history.

(56) References Cited

FOREIGN PATENT DOCUMENTS

| | | | |
|---|---|---|---|
| CN | 103869601 A | 6/2014 |
| CN | 105861985 A | 8/2016 |
| CN | 106191769 A | 12/2016 |
| CN | 108526729 A | 9/2018 |
| CN | 110438448 A | 11/2019 |
| KR | 10-0658762 B1 | 12/2006 |
| KR | 10-2010-0101919 A | 9/2010 |

OTHER PUBLICATIONS

Office Action received for Chinese Patent Application No. 201910851395, mailed on Jul. 23, 2021, 8 pages (5 pages of English Translation and 3 pages of Original Document).
Office Action received for Chinese Patent Application No. 201910851395, mailed on Oct. 27, 2021, 12 pages (7 pages of English Translation and 5 pages of Original Document).

ALIGNMENT MASK, METAL MASK ASSEMBLY, AND PREPARATION METHOD THEREFOR

CROSS-REFERENCE TO RELATED APPLICATIONS

This application is a US National Stage of International Application No. PCT/CN2020/109790, filed on Aug. 18, 2020, which claims the benefit of Chinese Patent Application CN201910851395.9, filed on Sep. 10, 2019, which is expressly incorporated by reference herein in their entirety.

FIELD

The embodiments of the present disclosure relate to the technical field of masks, evaporation and display, in particular to an alignment mask, a metal mask assembly, and a preparation method therefor.

BACKGROUND

Many film layer structures in organic light-emitting diodes (OLEDs) are formed by evaporation using a metal mask assembly (MMA), and a complete MMA typically consists of a mask frame, a fine metal mask (FMM), and an Align Mask.

SUMMARY

An align mask includes a mask body, wherein the mask body includes:
 a plurality of align holes, and
 an isolation part, enclosing at least part of the align holes and isolating an area where the at least part of the align holes are located from other areas,
  wherein the isolation part includes one or more half-etch lines.

According to some embodiments of the present disclosure, the mask body is strip-shaped, includes: a retention area, two cut-out areas located at two ends of the retention area, and two cut-out half-etch lines respectively located at junctions between the two cut-out areas and the retention area; wherein the two cut-out half-etch lines extend in a first direction which is the same as the extending direction of short edges of the mask body.

According to some embodiments of the present disclosure, the plurality of align holes are located in the retention area, are close to a first long edge of the mask body and are arrayed along the first long edge.

According to some embodiments of the present disclosure, the plurality of align holes include two fine align holes close to the two cut-out half-etch lines respectively, and coarse align holes located between the two fine align holes; each of the two cut-out half-etch lines is provided with a first part, and a projection of one of the two fine align holes close to the each cut-out half-etch line, on the each cut-out half-etch line is located in the first parts; and the first long edge is provided with two second parts corresponding to the two fine align holes respectively, and a projection of each of the two fine align holes, on the first long edge is located in the corresponding second part.

According to some embodiments of the present disclosure, the isolation part includes two first isolation parts respectively corresponding to the two fine align holes, wherein each first isolation part encloses a corresponding fine align hole and includes: a corresponding first part of a cut-out half-etch line, a first half-etch line located on one side, away from the corresponding first part, of the fine align hole, and a second half-etch line located on one side, away from a second part of the first long edge, of the fine align hole; the first half-etch line extends in the first direction, the second half-etch line extends in a second direction which is the same as an extending direction of long edges of the mask body; and
 the first part of the cut-out half-etch line, the second part of the first long edge, the first half-etch line and the second half-etch line are connected end to end to form a loop around the fine align hole.

According to some embodiments of the present disclosure, the mask body further includes at least two test openings which are close to a second long edge of the mask body and are arrayed along the second long edge, and the second long edge is a long edge opposite to the first long edge of the mask body; and
 the isolation part further includes a third half-etch line located between the plurality of align holes and the at least two test openings, the third half-etch line extends in the second direction, and two ends of the third half-etch line are connected with second half-etch lines of the two first isolation parts respectively.

According to some embodiments of the present disclosure, the two cut-out half-etch lines are provided with first parts respectively, and projections of the plurality of align holes, on the two cut-out half-etch lines are located in the first parts;
 the mask body further includes at least two test openings which are close to a second long edge of the mask body and are arrayed along the second long edge, and the second long edge is a long edge opposite to the first long edge of the mask body;
 the isolation part includes a second isolation part enclosing the plurality of align holes, wherein the second isolation part includes: the first parts of the two cut-out half-etch lines, and a fourth half-etch line located on one sides, away from the first long edge, of the plurality of align holes; and the fourth half-etch line extends in a second direction which is the same as an extending direction of long edges of the mask body; and
 the first parts of the two cut-out half-etch lines, the first long edge and the fourth half-etch line are connected end to end to form a loop around the plurality of align holes.

A preparation method of a metal mask assembly includes the following steps:
 respectively welding a fine metal mask and the align mask according to any of the preceding embodiments onto a mask frame; and
 cutting a mask body of the align mask along an isolation part for partitioning an area where at least part of align holes are located from other areas.

According to some embodiments of the present disclosure, the mask body includes two cut-out areas and two cut-out half-etch lines. The method further includes:
 cutting the mask body of the align mask along the two cut-out half-etch lines for cutting out the two cut-out areas of the mask body.

A metal mask assembly includes a mask frame, a fine metal mask and an align mask; wherein the fine metal mask and the align mask are respectively welded onto the mask frame; and
 the align mask includes a body of a retention area, the body of the retention area includes a plurality of align holes and a partitioning part partitioning an area where at least part of the plurality of align holes are located from other areas, and the partitioning part includes one or more cutting lines.

According to some embodiments of the present disclosure, the metal mask assembly further includes a first welding spot part between the align mask and the mask frame, and the first welding spot part is located in the area where the at least part of the plurality of align holes are located.

According to some embodiments of the present disclosure, the body of the retention area is strip-shaped; the plurality of align holes are close to a first long edge of the body of the retention area and are arrayed along the first long edge; the plurality of align holes include two fine align holes respectively close to two short edges of the body of the retention area, and coarse align holes located between the two fine align holes, wherein each short edge is provided with a first part, and a projection of one of the fine align holes close to the each short edge, on the each short edges is located in the first part; and the first long edge is provided with two second parts corresponding to the two fine align holes respectively, and a projection of each fine align hole, on the first long edge, is located in a corresponding second part.

According to some embodiments of the present disclosure, the partitioning part includes two first partitioning parts respectively corresponding to the two fine align holes, and each first partitioning part encloses a corresponding fine align hole and includes: a first cutting line located on one side, away from a first part of a corresponding short edge, of the fine align hole, and a second cutting line located on one side, away from a second part of the first long edge, of the fine align hole; the first cutting line extends in a first direction, the second cutting line extends in a second direction, the first direction is the same as an extending direction of the short edges of the body of the retention area, and the second direction is the same as an extending direction of long edges of the body of the retention area; and the first part, the second part of the first long edge, the first cutting line and the second cutting line are connected end to end to form a loop around the fine align hole.

According to some embodiments of the present disclosure, the metal mask assembly includes two first welding spot parts respectively corresponding to the two first partitioning parts; and each first welding spot part is located in an area enclosed by a corresponding first partitioning part, is arranged around the fine align hole, and is configured to fix an area where the fine align hole is located on the mask frame.

According to some embodiments of the present disclosure, the metal mask assembly further includes two second welding spot parts which are located between the align mask and the mask frame and respectively correspond to the two first partitioning parts; and each second welding spot part is close to a corresponding first partitioning part, is located on one side, away from a corresponding first part, of a corresponding first cutting line, and extends in the first direction.

According to some embodiments of the present disclosure, the body of the retention area further includes at least two test openings which are close to a second long edge of the body of the retention area and are arrayed along the second long edge, and the second long edge is a long edge opposite to the first long edge of the body of the retention area; and the partitioning part further includes a third cutting line located between the plurality of align holes and the at least two test openings, the third cutting line extends in the second direction, and two ends of the third cutting line are connected with second cutting lines of the two first partitioning parts respectively.

According to some embodiments of the present disclosure, the body of the retention area is strip-shaped; the plurality of align holes are close to a first long edge of the body of the retention area and are arrayed along the first long edge; short edges of the body of the retention area are provided with first parts respectively, and projections of the plurality of align holes, on the short edges, are located in the first parts;

the body of the retention area further includes at least two test openings which are close to a second long edge of the body of the retention area and are arrayed along the second long edge, and the second long edge is a long edge opposite to the first long edge of the body of the retention area;

the partitioning part includes a fourth cutting line located on one sides, away from the first long edge, of the plurality of align holes, and the fourth cutting line extends in a second direction which is the same as an extending direction of long edges of the body of the retention area; and the first parts of the two short edges, the first long edge and the fourth cutting line are connected end to end to form a loop around the plurality of align holes.

According to some embodiments of the present disclosure, the plurality of align holes include two fine align holes and coarse align holes located between the two fine align holes; and the metal mask assembly includes two first welding spot parts, and the two first welding spot parts are located in an area of a side, facing the plurality of align holes, of the fourth cutting line, and are respectively arranged around the two fine align holes.

DETAILED DESCRIPTION OF THE EMBODIMENTS

The technical solutions in embodiments of the present disclosure will be clearly and fully described in combination with the accompanying drawings in embodiments of the present disclosure, and it will be apparent that the described embodiments are only some but not all embodiments of the present disclosure. Based on the embodiments in the present disclosure, all other embodiments obtained by a person of ordinary skilled in the art without making inventive effort are within the scope of protection of the present disclosure.

Both a fine metal mask (FMM) and an align mask are welded onto a mask frame in a manner of a tensioning mesh, and the align mask is provided with evaporation align holes and test square holes with high fabrication accuracy. In existing evaporation manners, an evaporation assembly includes a magnet, a touch plate, a glass and the metal mask assembly (MMA); alignment (including coarse alignment and fine alignment) of the glass and MMA is performed by an align mark on the glass and the align holes on the align mask prior to evaporation, after fine alignment, the touch plate and the glass are subjected to pressing, and besides, the MMA is drawn up and attached to the glass by magnetic attraction of the magnet. In evaporation, a light-emitting material is evaporated onto a designated film layer through the fine metal mask (FMM) with many fine openings, and a pixel structure is formed. To ensure that the pattern position accuracy (PPA) of the evaporation can reach 8 µm or above, the accuracy of the fine alignment needs to be controlled within 5 µm, and the position accuracy of the magnet after attachment needs to be within 3 µm. The align holes of the align mask serve as references for evaporation alignment, and the position accuracy and the position stability of the align holes play a crucial role for the accuracy of the whole evaporation process, but in reality, as the number of evaporation times increases, the repeated action of magnetic force causes the align holes to be pulled and drift up to 10 µm or more, so that the position accuracy of the align holes cannot be guaranteed.

The embodiments of the present disclosure disclose an align mask, a metal mask assembly and a preparation method of the metal mask assembly, so as to increase the evaporation position accuracy of the mask assembly.

Figure 1:
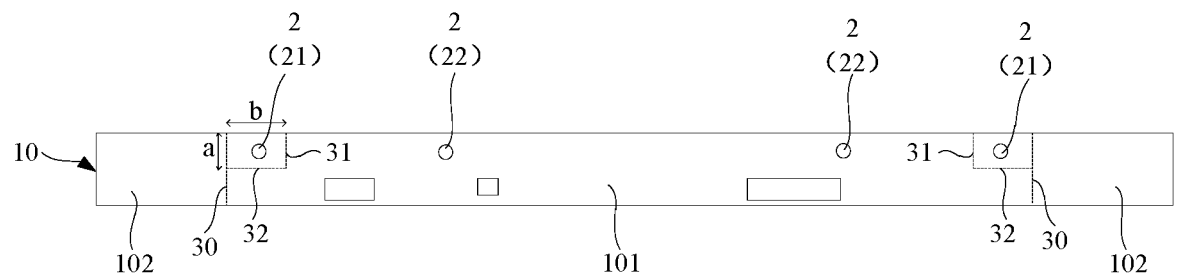
FIG. 1 is a structural diagram of an align mask according to an embodiment of the present disclosure.
Figure 2:
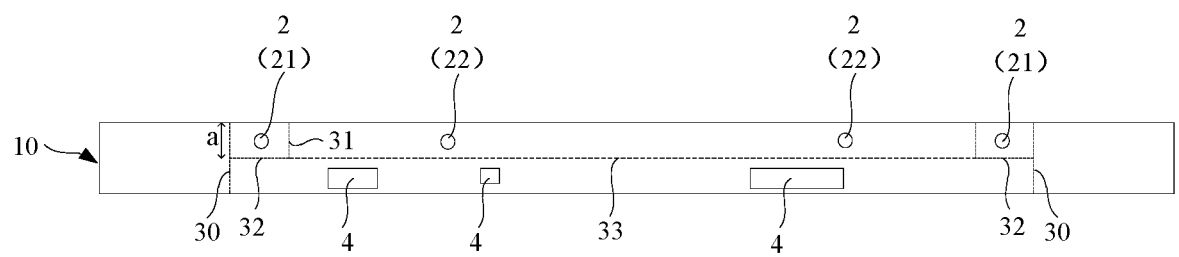
FIG. 2 is a structural diagram of an align mask according to another embodiment of the present disclosure.
Figure 3:
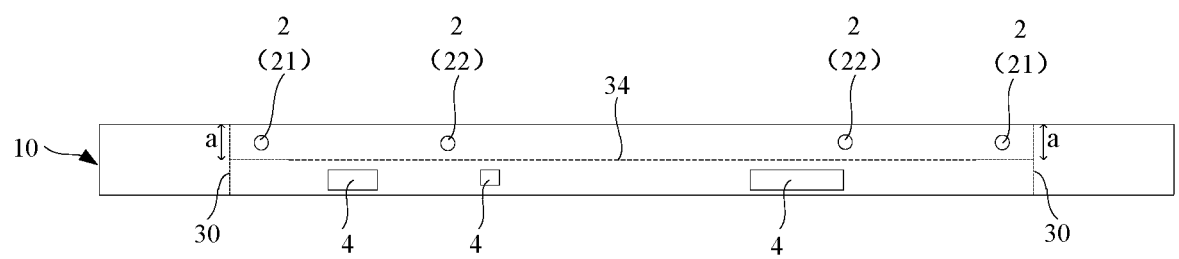
FIG. 3 is a structural diagram of an align mask according to another embodiment of the present disclosure.

As shown in FIGS. 1-3, the embodiments of the present disclosure provide the align mask including a mask body 10, wherein the mask body 10 is provided with a plurality of align holes 2 and an isolation part, the isolation part encloses at least part of the align holes 2 for isolating an area where the at least part of the align holes 2 are located from other areas, and the isolation part includes one or more half-etch lines (half-etch lines 30, 31, 32, 33, 34 as shown in the FIGS. 1-3); specifically, each half-etch line refers to a line-type etch pattern which is partially etched in thickness but not etched through.

The align mask can be cut along the isolation part after being welded onto the mask frame 6, to partition the area where the at least part of the align holes 2 are located from other areas, so that drift of the align holes 2 caused by magnetic attraction in multiple alignment processes can be blocked, further, the problem of reduced position accuracy of the align holes 2 after multiple alignment operations is solved, evaporation pattern position accuracy (PPA) can be increased, evaporation pixel color mixing yield of the OLED can be improved, in addition, the number of evaporation times of the align mask can be increased, and the replacement cost of the mask assembly is reduced.

In addition, the isolation part is formed on the align mask in the manner of half-etch lines, so that the difficulty of a cutting technology can be reduced, the cutting efficiency and accuracy can be improved, the separation process can be simplified, and the tensioning mesh of the align mask cannot be influenced.

As shown in FIGS. 1-3, in a specific embodiment, the mask body 10 is strip-shaped, the mask body 10 is divided into a retention area 101 and two cut-out areas 102 located at two ends of the retention area 101, and the mask body 10 includes two cut-out half-etch lines 30 respectively located at junctions between the two cut-out areas 102 and the retention area 101. Assuming that an extending direction of short edges of the mask body 10 is a first direction, and an extending direction of long edges of the mask body 10 is a second direction. The cut-out half-etch lines 30 extend in the first direction which is the same as the extending direction of the short edges of the mask body 10.

Figure 4:
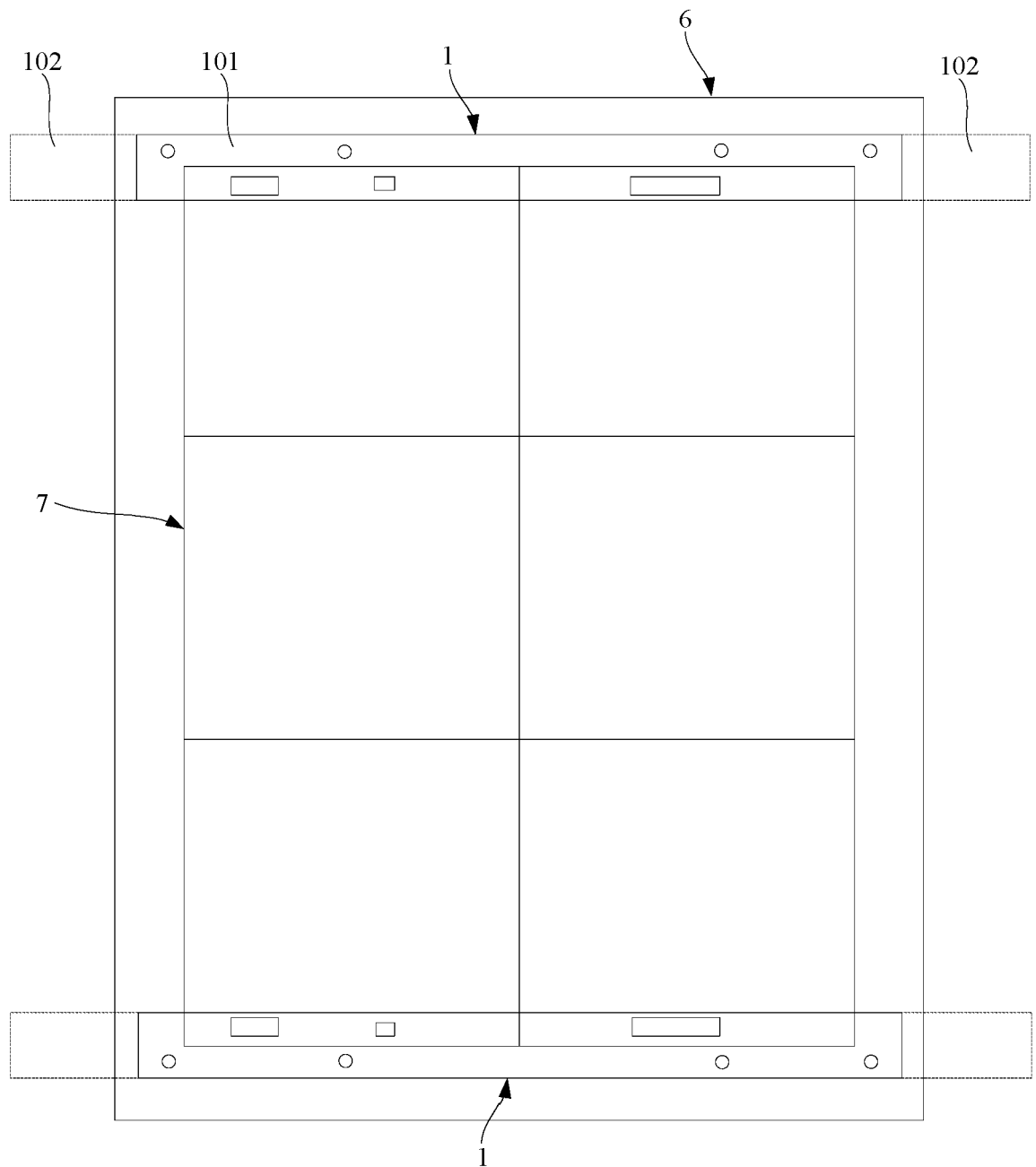
FIG. 4 is a whole structural diagram of a mask assembly according to an embodiment of the present disclosure.

Specifically, the mask body 10 is long, and can be convenient to subject to mesh tensioning and welded onto the mask frame 6. As shown in FIGS. 1 and 4, after the mask body 10 is welded onto the mask frame 6, the cut-out areas 102 at the two ends are beyond the edge of the mask frame 6, and at this moment, the two cut-out areas 102 at the two ends can be respectively cut out along the two cut-out half-etch lines 30, so that the align mask for evaporation only includes a body of the retention area 101 welded onto the mask frame 6, without the cut-out areas 102 at the two ends.

Exemplarily, as shown in FIGS. 1-3, the plurality of align holes 2 are located in the retention area 101, are close to a first long edge of the mask body 10, and are arrayed along the first long edge, i.e., are arrayed in the second direction.

Exemplarily, as shown in FIGS. 2 and 3, the mask body 10 further includes at least two test openings 4, wherein the at least two test openings 4 are close to a second long side of the mask body 10, and are arrayed in the second long edge, i.e., are arrayed in the second direction.

Exemplarily, as shown in FIGS. 1-3, the plurality of align holes 2 include: two fine align holes 21 respectively close to the two cut-out half-etch lines 30, and coarse align holes 22 located between the two fine align holes 21; i.e., the two fine align holes 21 are located in the two ends and are respectively close to the cut-out half-etch lines 30 on two sides, and the coarse align holes 22 are located between the two fine align holes 21. Each cut-out half-etch line 30 is provided with a first part "a", which is opposite to the fine align hole 21 close to the each cut-out half-etch line 30; and the projection of each fine align hole 21, on the close cut-out half-etch line 30, is located in the corresponding first part "a", i.e., the first parts "a" of the two cut-out half-etch lines 30 are respectively opposite to the two ends of a row of align holes 2. Each first long edge is provided with two second parts "b" respectively corresponding to the two fine align holes 21; and the projection of each fine align hole 21, on the corresponding first long edge, is located within the corresponding second part "b".

As shown in FIGS. 1 and 2, in a specific embodiment, the isolation part includes two first isolation parts respectively corresponding to the two fine align holes 21, and each first isolation part encloses the corresponding fine align hole 21. Each first isolation part includes: a first part "a" of the cut-out half-etch line 30; a first half-etch line 31 located on one side, away from the first part "a", of the fine align hole 21; and a second half-etch line 32 located on one side, away from the second part "b" of the first long edge, of the fine align hole 21. The first half-etch lines 31 extend in the first direction, and the second half-etch lines 32 extend in the second direction. The first part "a" of the cut-out half-etch line 30, the second part "b" of the first long edge, the first half-etch line 31 and the second half-etch line 32 are connected end to end to form a loop around the fine align hole 21.

Specifically, in the embodiments, the isolation part includes the two first isolation parts for isolating the two fine align holes 21 from other parts; and each first isolation part includes the first part "a" of the cut-out half-etch line 30, the first half-etch line 31 and the second half-etch line 32. As shown in FIG. 1, each first isolation part (the first part "a" of the cut-out half-etch line 30, the first half-etch line 31 and the second half-etch line 32) can be connected with the second part "b" of the first long edge, so as to enclose and isolate one corresponding fine align hole 21. Cutting is performed along the two first isolation parts in the embodiment, the two fine align holes 21 can be partitioned from the other parts of the mask body 10, and further, drift of the fine align holes 21 due to magnetic attraction during multiple alignment processes can be effectively avoided.

As shown in FIG. 2, based on the above embodiments, further, the plurality of align holes 2 are all close to the first long edge of the mask body 10, i.e., away from an evaporation area; and the at least two test openings 4 are both close to a second long edge of the mask body 10, i.e., close to the evaporation area. The isolation part may further include a third half-etch line 33 located between the plurality of align holes 2 and the at least two test openings 4, the third half-etch line 33 extends in the second direction, and the two ends of the third half-etch line are connected with the second half-etch lines 32 of the two first isolation parts respectively.

Specifically, the isolation part in the embodiments, on the basis of including the two first isolation parts, further includes the third half-etch line 33. Thus, cutting can be performed along the two first isolation parts to partition the two fine align holes 21 individually, and cutting can be further performed along the third half-etch line 33 to partition the area of the coarse align holes 22 from the area of the test openings 4; alternatively, cutting can also be selectively performed along an enclosed line formed by the first parts "a" of the two cut-out half-etch lines 30, the two second half-etch lines 32 and the third half-etch line 33 to partition the areas (the areas where the two fine align holes 21 and the coarse align holes 22 are located) of all the align holes 2 from the area of the test openings 4. In conclusion, according to the isolation part in the embodiments, part of the half-etch lines can be selected for partitioning, i.e., the area where the part of the align holes 2 are located is selectively partitioned from the other areas, thereby avoiding drift of the align holes 2 due to magnetic attraction.

As shown in FIG. 3, in another specific embodiment, an isolation part may include a second isolation part enclosing a plurality of align holes 2, wherein the second isolation part includes first parts "a" of two cut-out half-etch lines 30, and a fourth half-etch line 34 located on one sides, away from a first long edge, of the fine align holes 21; and the fourth half-etch line 34 extends in a second direction. The first parts "a" of the two cut-out half-etch lines 30, the first long edge and the fourth half-etch line 34 are connected end to end to form a loop around the plurality of align holes 2.

In the embodiments, the isolation part includes a second isolation part, wherein the second isolation part includes the first parts "a" of the two cut-out half-etch lines 30 and the fourth half-etch line 34. As shown in the FIG. 3, the first parts "a" of the two cut-out half-etch lines 30 and the fourth half-etch line 34 are connected with the first long edge of the mask body 10, so as to enclose and isolate all the align holes 2 (the two fine align holes 21 and the coarse align holes 22). Exemplarily, the fourth half-etch line 34 can correspond to a segment of the half-etch line formed by connection of the third half-etch line 33 and the two second half-etch lines 32 in the FIG. 1. Cutting is performed along the second isolation part in the embodiment, the area where all the align holes 2 are located can be isolated from the area where the test openings 4 are located, and further, drift of the align holes 2 due to magnetic attraction can be avoided.

It should be noted that according to the align masks provided by the embodiments of the present disclosure, the isolation parts are not limited to the design in the embodiments; and specifically, the half-etch lines included in the isolation parts of the embodiments of the present disclosure may further include other forms, as long as the half-etch lines can be used for isolating the areas where at least part of the align holes are located from the other areas.

Figure 8:
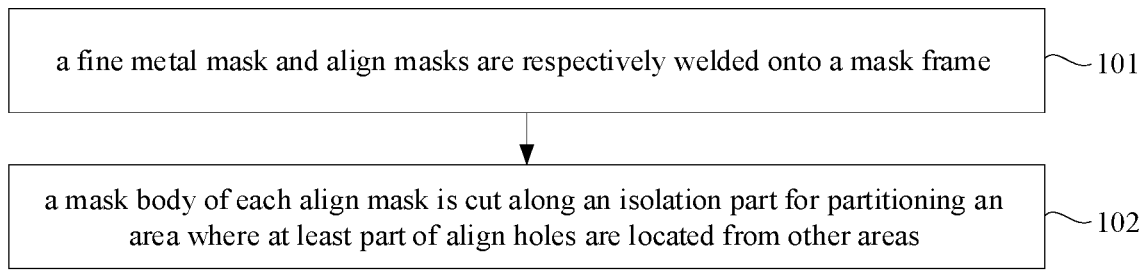
FIG. 8 is a flowchart of a preparation method of a mask assembly according to an embodiment of the present disclosure.

On the basis of the align mask provided by any embodiment of the present disclosure, the embodiment of the present disclosure further provides a preparation method of a metal mask assembly, as shown in FIG. 8. The method includes the following steps.

Step 101, a fine metal mask and the align masks are respectively welded onto a mask frame: specifically, the align masks are firstly welded onto the mask frame, and then the fine metal mask are welded by taking the positions of the align masks as references.

Step 102, a mask body of each align mask is cut along a corresponding isolation part for partitioning an area where at least part of the align holes are located from other areas.

In a specific embodiment, as shown in FIGS. 1-3, a mask body 10 of each align mask includes two cut-out areas 102 and two cut-out half-etch lines 30. The method further includes:

as shown in FIGS. 1-4, respectively cutting the mask body 10 of each align mask along the two cut-out half-etch lines 30, so as to cut out the two cut-out areas 102 of each mask body 10.

In a specific embodiment, the step of welding the align masks onto the mask frame specifically includes: forming welding spot parts in at least part of the align hole area enclosed by the partitioning part of the mask body, and through the welding spot parts, partially welding the align hole area enclosed by the partitioning part onto the mask frame. Exemplarily, as shown in FIGS. 5-7, when two fine align holes 21 are enclosed by the partitioning part, two first welding spot parts 51 respectively enclosing the two fine align holes 21 are formed in the area enclosed by the partitioning part.

Figure 5:
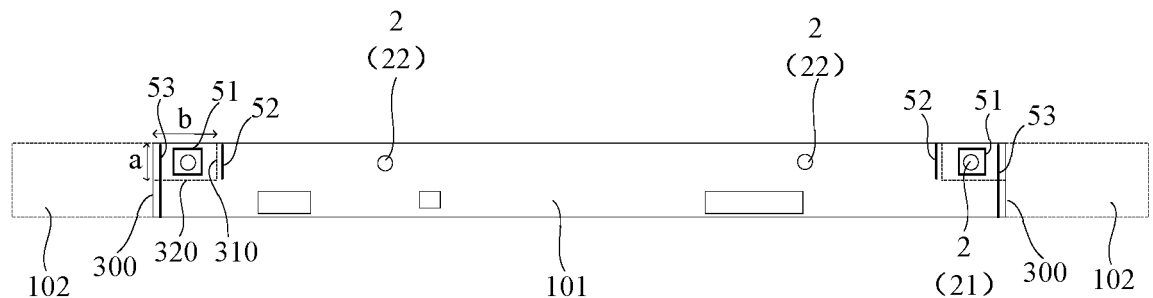
FIG. 5 is a structural diagram of an align mask and welding spot parts in the mask assembly according to an embodiment of the present disclosure.
Figure 6:
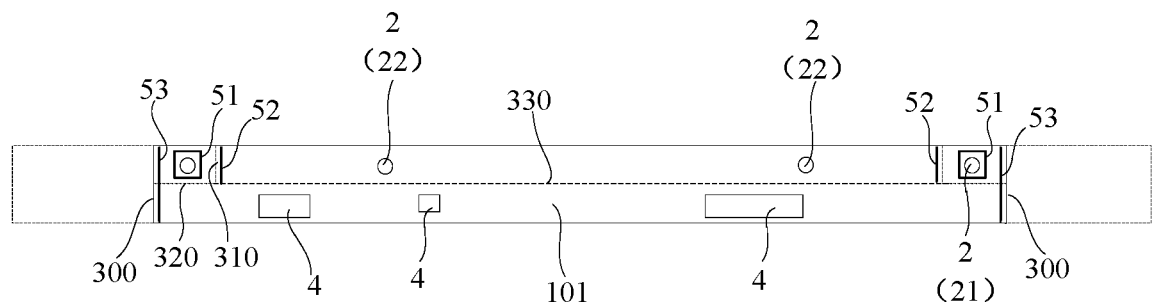
FIG. 6 is a structural diagram of an align mask and welding spot parts in the mask assembly according to another embodiment of the present disclosure.
Figure 7:
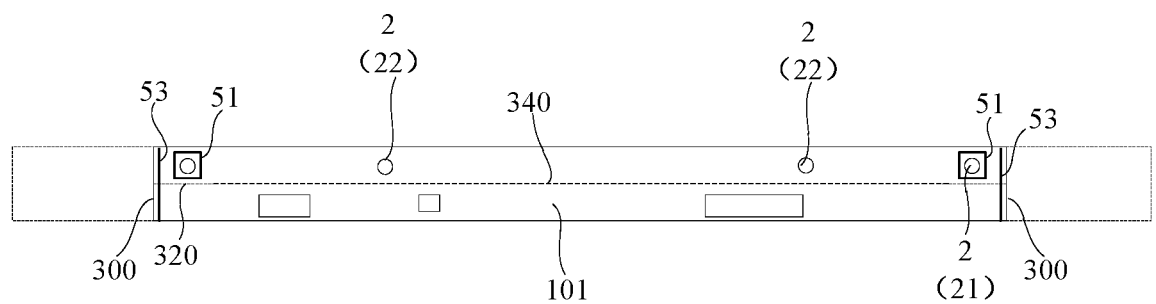
FIG. 7 is a structural diagram of an align mask and welding spot parts in the mask assembly according to another embodiment of the present disclosure.

Further, the step of welding the align masks on the mask frame 6 further includes: forming welding spot parts (second welding spot parts 52 and part of third welding spot parts 53 as shown in FIGS. 5-7) in areas except the area enclosed by the partitioning part of the mask body 10, and through the welding spot parts, partially welding the part except the area enclosed by the partitioning part onto the mask frame 6.

In addition, on the basis of the align masks provided by the embodiments of the present disclosure, an embodiment of the present disclosure further provides a metal mask assembly. As shown in FIG. 4, the metal mask assembly includes a mask frame 6, a fine metal mask 7 and align masks 1; wherein the fine metal mask 7 and the align masks 1 are respectively welded onto the mask frame 6. As shown in FIGS. 5-7, each align mask 1 includes a body of a retention area 101 and a partitioning part; a plurality of align holes 2 are formed in the body of the retention area 101; the partitioning part partitions an area where at least part of the align holes 2 are located from other areas; and the partitioning part includes one or more cutting lines (cutting lines 310, 320, 330, 340 as shown in FIGS. 5-7).

Specifically, in the metal mask assembly provided by the embodiments of the present disclosure, the body of the align mask is a cut body, cut-out areas 102 at two ends are cut out, and therefore, only the body of the retention area 101 remains. Besides, the cutting lines are line-type cutting patterns obtained in a manner that cutting is performed along half-etch lines so that parts which are not etched through in half-etch line patterns are thoroughly partitioned.

In the fine mask assembly, the partitioning part arranged on the body of the retention area 101 of each align mask can partition the area, where at least part of the align holes 2 are located in the body of the retention area 101, from the other areas, so that drift of the align holes 2 caused by magnetic attraction in multiple alignment processes can be blocked, further, the problem of reduced position accuracy of the align holes 2 after multiple alignment operations is avoided, the evaporation pattern position accuracy (PPA) can be increased, evaporation pixel color mixing yield of the OLED can be improved, in addition, the number of evaporation uses of each align mask can be increased, and the replacement cost of the mask assembly is reduced.

As shown in FIGS. 4-7, in a specific embodiment, a metal mask assembly further includes first welding spot parts 51 between align masks 1 and a mask frame 6; and the first welding spot parts 51 are located in the area, where the at least part of align holes 2 are located, enclosed by a partitioning part of a body of a retention area 101.

The area where at least part of the align holes 2 are located (the area enclosed by the partitioning part) is fixed to the mask frame 6 through the first welding spot parts 51, so that after the area where at least part of the align holes 2 are located is partitioned from other areas, relative positions are not changed. Besides, the area where at least part of the align holes 2 are located (the area enclosed by the partitioning part) is subjected to reinforced welding by the first welding spot parts 51, so that drift of the align holes 2 can be further blocked, and the position accuracy of the align holes 2 can be guaranteed.

As shown in FIGS. 5-7, in a specific embodiment, the body of each retention area 101 is strip-shaped; and the plurality of align holes 2 are close to a first long edge of the body of each retention area 101 and are arrayed along the first long edge. Specifically, two long edges of the body of each retention area 101 correspond to two long edges of each mask body 10 which is not cut, and two short edges 300 of the body of each retention area 101 correspond to the two cut-out half-etch lines 30 before being cut, namely, two short edges 300 of the body of each retention area 101 are two edges formed after cutting out the two cut-out parts 102 along the two cut-out half-etch lines 30.

Further, the align holes 2 include: two fine align holes 21 close to the two short edges 300 of the body of each retention area 101, and coarse align holes 22 located between the two fine align holes 21. Each short edge 300 is provided with a first part "a" opposite to the close fine align hole 21; and the projection of each fine align hole 21, on the close short edge 300 is located in the corresponding first part "a". Each first long edge is provided with two second parts "b" opposite to the two fine align holes 21 respectively; and the projection of each fine align hole 21, on the first long edge is located in the corresponding second part "b".

As shown in FIGS. 5 and 6, in a specific embodiment, each partitioning part includes two first partitioning parts respectively corresponding to the two fine align holes 21; each first partitioning part encloses the corresponding fine align hole 21; each first partitioning part includes a first cutting line 310 (corresponding to a first half-etch line 31 before being cut in FIGS. 1 and 2) located on one side, away from the first part "a", of the fine align hole 21, and a second cutting line 320 (corresponding to a second half-etch line 32 before being cut in FIGS. 1 and 2) located on one side, away from the second part "b" of the first long edge, of the fine align hole 21. The first cutting lines 310 extend in the first direction, the second cutting lines 320 extend in the second direction, the first direction is the same as the extending direction of the short edges 300 of the body of each retention area 101, and the second direction is the same as the extending direction of the long edges of the body of each retention area 101. The first part "a", the second part "b" of each first long edge, the first cutting line 310 and the second cutting line 320 are connected end to end to form a loop around the fine align hole 21.

According to the align masks in the embodiments, before cutting, as shown in FIG. 1, the mask body 10 includes two first isolation parts isolating the two fine align holes 21 from other parts respectively, each first isolation part includes first parts a of the cut-out half-etch lines 30, first half-etch lines 31 and second half-etch lines 32, and after cutting is performed along the two first partitioning parts, patterns of the two first partitioning parts can be formed. Specifically, after cutting, as shown in FIG. 5, the cut-out areas 102 at the two ends of each align mask 1 are cut out, only the body of each retention area 101 remains, the two first partitioning parts are located on the body of each retention area 101, and the two fine align holes 21 are partitioned from the other parts respectively; and each first partitioning part includes the first cutting line 310 (corresponding to the first half-etch line 31 before being cut) and the second cutting line 320 (corresponding to the second half-etch line 32 before being cut). It should be noted that the cut-out half-etch lines 30 do not exist after cutting operations, so that each first partitioning part does not include the cutting line corresponding to the first part "a" of the cut-out half-etch line 30.

Exemplarily, as shown in FIGS. 5 and 6, at this moment, the metal mask assembly may include two first welding spot parts 51 corresponding to the two first partitioning parts; and each first welding spot part 51 is located in an area enclosed by the corresponding first partitioning part, is arranged around the fine align hole 21, and is configured to fix the area where the fine align hole 21 is located, on the mask frame. The areas where the two fine align holes 21 are located are fixed to the mask frame 6 through the two first welding spot parts 51, so that after the two fine align holes 21 are partitioned from other areas, relative positions are not changed. Besides, each first welding spot part 51 encloses the corresponding fine align hole 21, so that drift of the fine align holes 21 can be further blocked, and the position accuracy of the fine align holes 21 can be guaranteed.

Exemplarily, as shown in FIGS. 5 and 6, the metal mask assembly may further include two second welding spot parts 52, wherein the two second welding spot parts 52 are located between the align mask 1 and the mask frame 6 and respectively correspond to the two first partitioning parts; and each second welding spot part 52 is close to the first partitioning part corresponding to the each second welding spot part 52, is located on one side, away from the corresponding first part "a", of the first cutting line 310 of the corresponding first partitioning part, and extends in the first direction.

Further, as shown in FIGS. 5 and 6, the metal mask assembly further includes two third welding spot parts 53 respectively corresponding to the two short edges 300 of the body of each retention area 101, wherein each third welding spot part 53 is close to the corresponding short edge 300 and extends in the first direction.

Specifically, in the process of preparing the metal mask assembly disclosed by the embodiments of the present disclosure, as shown in FIGS. 1-7, when the align masks 1 are subjected to mesh tensioning, firstly, alignment of the mask bodies 10 and the mask frame 6 is performed, after alignment is completed, the third welding spot parts 53 (at the cut-out half-etch lines 30), the first welding spot parts 51 (around the fine align holes 21) and the second welding spot parts 52 at the left ends and the right ends of the mask bodies are welded (symmetry welding is performed on the left part and the right part at the same time during welding); and after mesh tensioning is completed, the cut-out parts 102 at the two ends are cut out along the two cut-out half-etch lines 30, then cutting is performed along the first half-etch lines 31 and the second half-etch lines 32 of the two first isolation parts, to form the two first partitioning parts, and further the area where the two fine align holes 21 are located can be isolated from other parts.

Further, as shown in FIG. 6, the body of each retention area 101 further includes at least two test openings 4 which are close to the corresponding second long edge and are arrayed along the corresponding second long edge.

Exemplarily, as shown in FIG. 6, the align holes 2 are all close to the first long edge of the body of each retention area 101, i.e., away from an evaporation area; and at least two test openings 4 are both close to the second long edge of the body of each retention area 101, i.e., close to the evaporation area. Each partitioning part may further include a third cutting line 330 (corresponding to the third half-etch line 33 before being cut in FIG. 2) located between the plurality of align holes 2 and the at least two test openings 4, the third cutting line 330 extends in the second direction, and the two ends of the third cutting line 330 are connected with the second cutting lines 320 of the two first partitioning parts respectively.

In the embodiments, on the basis of including the two first partitioning parts, each partitioning part further includes the third cutting line 330 (corresponding to the third half-etch line 33 before being cut). Hence, in the embodiment, the area where the fine align holes 21 are located can be individually partitioned, and the areas where all the align holes 2 are located can also be partitioned from the area where the test openings 4 are located, so that shift of the align holes 2 during the alignment operations can be avoided to the maximum extent.

Certainly, according to the metal mask assembly provided by the embodiment of the present disclosure, the body of the retention area 101 of each align mask 1 may further include half-etch lines; for example, before cutting, each mask body 10 is provided with a plurality of half-etch lines, during cutting, cutting can be selectively performed along part of the half-etch lines. Exemplarily, as shown in FIGS. 2 and 6, cutting can be performed along the cut-out half-etch lines 30 and the first isolation parts, but the third half-etch line 33 is not cut, at this moment, in the metal mask assembly provided by the embodiment of the present disclosure, the body of the retention area 101 of each align mask 1 retains the third half-etch line 33, and correspondingly, the third cutting line 330 is not generated. Or, cutting can be selectively performed along the two cut-out half-etch lines 30, the two second half-etch lines 32 and the third half-etch line 33, so that the areas where all the align holes 2 are located can be isolated from the area where the test openings 4 are located, at this moment, in the metal mask assembly provided by the embodiment of the present disclosure, the body of the retention area 101 of each align mask 1 retains the two first half-etch lines 31, and correspondingly, the first cutting lines 310 are not generated.

As shown in FIG. 7, in another specific embodiment, each partitioning part includes a fourth cutting line 340 (corresponding to the fourth half-etch line 34 before being cut in FIG. 3) located on one sides, away from a first long edge, of the fine align holes 21; and the fourth cutting line 340 extends in a second direction which is the same as the extending direction of the long edge of the body of each retention area 101. First parts "a" of two short edges 300, the first long edge and the fourth cutting line 340 are connected end to end to form a loop around a plurality of align holes 2.

In the embodiment, each partitioning part only includes the fourth cutting line 340 (corresponding to the fourth half-etch line 34 before being cut), and the fourth cutting line 340 can partition the areas where all the align holes 2 are located from the area where test openings 4 are located, so that shift of the align holes 2 due to influence of magnetism on the alignment operations can be avoided.

Exemplarily, as shown in FIG. 7, at this moment, the metal mask assembly may include two first welding spot parts 51, the two first welding spot parts 51 are located in the area enclosed by first partitioning parts and are arranged around the two fine align holes 21, so that the area enclosed by the whole first partitioning parts can be fixed on the mask frame, the two fine align holes 21 can be prevented from being pulled by other parts around, the position drift of the fine align holes 21 can be further avoided, and evaporation accuracy can be guaranteed. Further, the metal mask assembly further includes two third welding spot parts 53 respectively extending along the two short edges 300 of the body of each retention area 101.

It should to be noted that according to the metal mask assemblies provided by the embodiments of the present disclosure, the partitioning parts of the align masks and the welding spot parts are not limited to design in the embodiments, and other design forms can also be included; and specifically, the partitioning parts only need to partition the areas where at least part of the align holes are located from other areas, and the welding spot parts only need to ensure that the partitioned parts are welded to the mask frames.

It will be apparent to those skilled in the art that various modifications and variations can be made to the embodiments of the present disclosure without departing from the spirit and scope of the present disclosure. In this way, under the condition that these modifications and variations of the present disclosure belong to the scope of the claims of the present disclosure and their equivalent technology, the present disclosure is also intended to include these modifications and variations.

What is claimed is:

1. An align mask, comprising a mask body, wherein the mask body comprises:
   a plurality of align holes; and
   an isolation part, enclosing at least two of the align holes and isolating an area, where the at least two of the align holes are arranged, from other areas;
   wherein the isolation part comprises one or more half-etch lines;
   the mask body is strip-shaped,
   the mask body comprises:
      a retention area,
      two cut-out areas arranged at two ends of the retention area; and two cut-out half-etch lines respectively arranged at junctions between the two cut-out areas and the retention area; and the two cut-out half-etch lines extend in a first direction which is the same as an extending direction of short edges of the mask body.

2. The align mask according to claim 1, wherein the plurality of align holes are arranged in the retention area, are closer to a first long edge of the mask body than a second long edge of the mask body and are arrayed along the first long edge, the second long edge is a long edge opposite to the first long edge of the mask body.

3. The align mask according to claim 2, wherein the plurality of align holes comprise:

two first align holes, and second align holes arranged between the two first align holes;

wherein the two first align holes are closer to the two cut-out half-etch lines respectively than the second align holes;

each of the two cut-out half-etch lines is provided with a first part, and a projection of one of the two first align holes is closer to the each cut-out half-etch line than the second align holes, on the each cut-out half-etch line, is arranged in the first part; and the first long edge is provided with two second parts corresponding to the two first align holes respectively, and a projection of each of the two first align holes, on the first long edge, is arranged in a corresponding second part.

4. The align mask according to claim 3, wherein the isolation part comprises two first isolation parts respectively corresponding to the two first align holes;

each of the two first isolation parts encloses a corresponding first align hole;

the each of the two first isolation parts comprises:

a corresponding first part of a cut-out half-etch line, a first half-etch line arranged on one side, away from the corresponding first part, of the first align hole, and a second half-etch line arranged on one side, away from a second part of the first long edge, of the first align hole;

the first half-etch line extends in the first direction, and the second half-etch line extends in a second direction which is the same as an extending direction of long edges of the mask body; and the corresponding first part of the cut-out half-etch line, the second part of the first long edge, the first half-etch line and the second half-etch line are connected end to end to form a loop around the first align hole.

5. The align mask according to claim 4, wherein the mask body further comprises at least two test openings; the at least two test openings are closer to the second long edge of the mask body than the first long edge of the mask body and are arrayed along the second long edge; and the isolation part further comprises a third half-etch line arranged between the plurality of align holes and the at least two test openings, the third half-etch line extends in the second direction, and two ends of the third half-etch line are connected with second half-etch lines of the two first isolation parts respectively.

6. The align mask according to claim 2, wherein the two cut-out half-etch lines are provided with first parts respectively; and projections of the plurality of align holes, on the two cut-out half-etch lines, are arranged in the first parts;

the mask body further comprises at least two test openings, wherein the at least two test openings are closer to the second long edge of the mask body than the first long edge of the mask body and are arrayed along the second long edge;

the isolation part comprises a second isolation part enclosing the plurality of align holes, wherein the second isolation part comprises:

the first parts of the two cut-out half-etch lines, and a fourth half-etch line arranged on one sides, away from the first long edge, of the plurality of align holes, and the fourth half-etch line extends in a second direction which is the same as an extending direction of long edges of the mask body; and the first parts of the two cut-out half-etch lines, the first long edge and the fourth half-etch line are connected end to end to form a loop around the plurality of align holes.

7. A preparation method of a metal mask assembly, comprising:

respectively welding a metal mask and the align mask according to claim 1 onto a mask frame; and cutting a mask body of the align mask along an isolation part, for partitioning an area where at least part of align holes are arranged from other areas.

8. The preparation method according to claim 7, wherein the mask body comprises two cut-out areas and two cut-out half-etch lines, and the method further comprises:

cutting the mask body of the align mask along the two cut-out half-etch lines, for cutting out the two cut-out areas of the mask body.

9. A metal mask assembly, comprising a mask frame, a metal mask, an align mask, and a first welding spot part between the align mask and the mask frame;

wherein the metal mask and the align mask are respectively welded onto the mask frame;

the align mask comprises a body of a retention area;

the body of the retention area comprises:

a plurality of align holes, and a partitioning part, partitioning an area where at least two of the plurality of align holes are arranged from other areas; and the partitioning part comprises one or more cutting lines;

the first welding spot part is arranged in the area where the at least two of the plurality of the align holes are arranged;

the body of the retention area is strip-shaped;

the plurality of align holes are closer to a first long edge of the body of the retention area than a second long edge of the body of the retention area, and are arrayed along the first long edge;

the second long edge is a long edge opposite to the first long edge of the body of the retention area;

the plurality of align holes comprise:

two first align holes; and second align holes arranged between the two first align holes;

wherein the two first align holes are respectively closer to two short edges of the body of the retention area than the second align holes;

each of the short edges is provided with a first part, and a projection of one of the first align holes is closer to the each short edge than the second align holes, on the each short edge is arranged in the first part; and the first long edge is provided with two second parts corresponding to the two first align holes respectively, and a projection of each of the two first align holes, on the first long edge, is arranged in a corresponding second part.

10. The metal mask assembly according to claim 9, wherein
the partitioning part comprises two first partitioning parts respectively corresponding to the two first align holes;
each of the two first partitioning parts encloses a corresponding first align hole;
the each of the two first partitioning parts comprises:
a first cutting line arranged on one side, away from a first part of a corresponding short edge, of the first align hole; and
a second cutting line arranged on one side, away from a second part of the first long edge, of the first align hole;
the first cutting line extends in a first direction, and the second cutting line extends in a second direction;
the first direction is the same as an extending direction of the short edges of the body of the retention area, and the second direction is the same as an extending direction of long edges of the body of the retention area; and
the first part, the second part of the first long edge, the first cutting line and the second cutting line are connected end to end to form a loop around the first align hole.

11. The metal mask assembly according to claim 10, comprising two first welding spot parts respectively corresponding to the two first partitioning parts;
wherein each of the two first welding spot parts is arranged in an area enclosed by a corresponding first partitioning part, is arranged around the first align hole, and is configured to fix an area where the first align hole is arranged on the mask frame.

12. The metal mask assembly according to claim 11, further comprising two second welding spot parts;
wherein the two second welding spot parts are arranged between the align mask and the mask frame, and respectively correspond to the two first partitioning parts;
wherein each second welding spot part is closer to a corresponding first partitioning part than the second align holes; is arranged on one side, away from a corresponding first part, of a corresponding first cutting line; and extends in the first direction.

13. The metal mask assembly according to claim 10, wherein
the body of the retention area further comprises at least two test openings; the at least two test openings are closer to the second long edge of the body of the retention area
than the first long edge of the body of the retention area and are arrayed along the second long edge; and
the partitioning part further comprises a third cutting line arranged between the plurality of align holes and the at least two test openings, the third cutting line extends in the second direction, and two ends of the third cutting line are connected with second cutting lines of the two first partitioning parts respectively.

14. A metal mask assembly, comprising a mask frame, a metal mask, an align mask, and a first welding spot part between the align mask and the mask frame;
wherein the metal mask and the align mask are respectively welded onto the mask frame;
the align mask comprises a body of a retention area;
the body of the retention area comprises:
a plurality of align holes, and
a partitioning part, partitioning an area where at least two of the plurality of align holes are arranged from other areas; and
the partitioning part comprises one or more cutting lines;
the first welding spot part is arranged in the area where the at least two of the plurality of the align holes are arranged;
the body of the retention area is strip-shaped; the plurality of align holes is closer to a first long edge of the body of the retention area than a second long edge of the body of the retention area and are arrayed along the first long edge; the second long edge is a long edge opposite to the first long edge of the body of the retention area; short edges of the body of the retention area are provided with first parts respectively; and projections of the plurality of align holes, on the short edges, are arranged in the first parts;
the body of the retention area further comprises at least two test openings, the at least two test openings are closer to the second long edge of the body of the retention area than the first long edge of the body of the retention area and are arrayed along the second long edge;
the partitioning part comprises a fourth cutting line arranged on one sides, away from the first long edge, of the plurality of align holes; and the fourth cutting line extends in a second direction which is the same as an extending direction of long edges of the body of the retention area; and
the first parts of the two short edges, the first long edge and the fourth cutting line are connected end to end to form a loop around the plurality of align holes.

15. The metal mask assembly according to claim 14, wherein the plurality of align holes comprise two first align holes and second align holes arranged between the two first align holes;
the metal mask assembly comprises two first welding spot parts; and
the two first welding spot parts are arranged in an area of a side, facing the plurality of align holes, of the fourth cutting line, and are respectively arranged around the two first align holes.

* * * * *